US007145415B2

(12) United States Patent
Sengupta et al.

(10) Patent No.: US 7,145,415 B2
(45) Date of Patent: *Dec. 5, 2006

(54) ELECTRICALLY TUNABLE FILTERS WITH DIELECTRIC VARACTORS

(75) Inventors: Louise C. Sengupta, Warwick, MD (US); Steven C. Stowell, Columbia, MD (US); Yongfei Zhu, Columbia, MD (US); Somnath Sengupta, Warwick, MD (US); Luna H. Chiu, Abingdon, MD (US); Xubai Zhang, Columbia, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/979,001

(22) Filed: Nov. 1, 2004

(65) Prior Publication Data

US 2005/0088255 A1 Apr. 28, 2005

Related U.S. Application Data

(63) Continuation of application No. 09/457,943, filed on Dec. 9, 1999.

(60) Provisional application No. 60/111,888, filed on Dec. 11, 1998.

(51) Int. Cl.
*H03H 7/01* (2006.01)

(52) U.S. Cl. ...................................... 333/174; 333/175

(58) Field of Classification Search ........ 333/174–176, 333/167, 168, 210, 99 S; 505/210; 361/311, 361/277
See application file for complete search history.

(56) References Cited

U.S. PATENT DOCUMENTS

| | | | | |
|---|---|---|---|---|
| 5,376,907 | A | | 12/1994 | Duflot et al. |
| 5,496,795 | A | | 3/1996 | Das |
| 5,496,796 | A | | 3/1996 | Das |
| 5,640,042 | A | | 6/1997 | Koscica et al. |
| 5,693,429 | A | | 12/1997 | Sengupta et al. |
| 5,721,194 | A | | 2/1998 | Yandrofski et al. |
| 5,752,179 | A | | 5/1998 | Dobrovolny |
| 5,877,123 | A | | 3/1999 | Das |
| 5,900,390 | A | | 5/1999 | Das |
| 5,908,811 | A | | 6/1999 | Das |
| 5,917,387 | A | | 6/1999 | Rice et al. |
| 6,096,127 | A | * | 8/2000 | Dimos et al. .................. 117/9 |
| 6,727,535 | B1 | * | 4/2004 | Sengupta et al. ........... 257/295 |

FOREIGN PATENT DOCUMENTS

| | | |
|---|---|---|
| JP | 09270338 | 10/1997 |
| WO | WO 94/13028 | 6/1994 |

OTHER PUBLICATIONS

Gevorgian et al., "Electrically controlled HTSC/ferroelectric coplanar waveguide", *IEE Proc. Microw. Antennas Propag.*, Dec. 1994, pp. 501-503, vol. 141, No. 6.
Kozyrev et al., "Ferroelectric Films: Nonlinear Properties and Applications in Microwave Devices", *IEEE*, 1998, pp. 985-988.

* cited by examiner

*Primary Examiner*—Stephen E. Jones
(74) *Attorney, Agent, or Firm*—James S. Finn

(57) ABSTRACT

This invention provides a voltage tunable filter comprising an input connection point, an output connection point, and at least one circuit branch electrically coupled to the input connection point and the output connection point and including a voltage tunable dielectric varactor electrically connected to an inductor. The voltage tunable filter can be one of a low-pass, high-pass, band-pass, or band-stop filter. The varactor can include built-in DC blocking capacitors.

13 Claims, 6 Drawing Sheets

ELECTRICALLY TUNABLE FILTERS WITH DIELECTRIC VARACTORS

CROSS REFERENCE TO RELATED PATENT APPLICATION

This application is a continuation application of U.S. patent application Ser. No. 09/457,943, entitled, "ELECTRICALLY TUNABLE FILTERS WITH DIELECTRIC VARACTORS" filed Dec. 9, 1999, by Louise C. Sengupta, which claimed the benefit of U.S. Provisional Patent Application No. 60/111,888, filed Dec. 11, 1998.

BACKGROUND OF INVENTION

The present invention relates generally to electronic filters and more particularly to filters that include tunable varactors.

Electronic filters are widely used in radio frequency (RF) and microwave circuits. Tunable filters may significantly improve the performance of the circuits, and simplify the circuits. There are two well-known kinds of analog tunable filters used in RF applications, one is electrically tuned, usually by diode varactor, and the other is mechanically tuned. Mechanically tunable filters have the disadvantages of large size, low speed, and heavy weight. Diode-tuned filters that include conventional semiconductor varactor diodes suffer from low power handling capacity, that is limited by intermodulation of the varactor, which causes signals to be generated at frequencies other than those desired. This intermodulation is caused by the highly nonlinear response of conventional semiconductor varactors to voltage control.

Tunable filters for use in radio frequency circuits are well known. Examples of such filters can be found in U.S. Pat. Nos. 5,917,387, 5,908,811, 5,877,123, 5,869,429, 5,752,179, 5,496,795 and 5,376,907.

Varactors can be used as tunable capacitors in tunable filters. Common varactors used today are Silicon and GaAs based diodes. The performance of these varactors is defined by the capacitance ratio, $C_{max}/C_{min}$, frequency range and figure of merit, or Q factor (1/tan δ) at the specified frequency range. The Q factors for these semiconductor varactors for frequencies up to 2 GHz are usually very good. However, at frequencies above 2 GHz, the Q factors of these varactors degrade rapidly. At 10 GHz the Q factors for these varactors are usually only about 30.

Varactors that utilize a thin film ferroelectric ceramic as a voltage tunable element in combination with a superconducting element have been described. For example, U.S. Pat. No. 5,640,042 discloses a thin film ferroelectric varactor having a carrier substrate layer, a high temperature superconducting layer deposited on the substrate, a thin film dielectric deposited on the metallic layer, and a plurality of metallic conductive means disposed on the thin film dielectric, which are placed in electrical contact with RF transmission lines in tuning devices. Another tunable capacitor using a ferroelectric element in combination with a superconducting element is disclosed in U.S. Pat. No. 5,721,194.

Commonly owned U.S. patent application Ser. No. 09/419,126, filed Oct. 15, 1999, and titled "Voltage Tunable Varactors And Tunable Devices Including Such Varactors", discloses voltage tunable varactors that operate at room temperature and various devices that include such varactors. Commonly owned U.S. patent application Ser. No. 09/434,433, filed Nov. 4, 1999, and titled "Ferroelectric Varactor With Built-In DC Blocks" discloses voltage tunable varactors that include built-in DC blocking capacitors. These varactors operate at room temperatures to provide a tunable capacitance.

There is a need for tunable filters that can operate at radio frequencies with reduced intermodulation products and at temperatures above those necessary for superconduction.

SUMMARY OF INVENTION

This invention provides a voltage tunable filter comprising an input connection, an output connection, and a circuit branch electrically coupled to the input connection and the output connection and including a voltage tunable dielectric varactor electrically connected to an inductor. The voltage tunable filter can be one of a low-pass, high-pass, band-pass, or band-stop filter. The varactor can include built-in DC blocking capacitors.

In the preferred embodiment, the voltage tunable dielectric varactor includes a substrate having a first dielectric constant and having a generally planar surface, a tunable dielectric layer positioned on the generally planar surface of the substrate, with the tunable dielectric layer having a second dielectric constant greater than the first dielectric constant, and first and second electrodes positioned on a surface of the tunable dielectric layer opposite the generally planar surface of the substrate. The first and second electrodes are separated to form a gap therebetween. A bias voltage applied to the electrodes changes the capacitance of the varactor between an input and an output thereof.

The present invention provides radio frequency (RF) electrically tunable filters, tuned by dielectric voltage-variable capacitors. The filters can handle high power with lower intermodulation distortion.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE PREFERRED EMBODIMENTS

Figure 1:
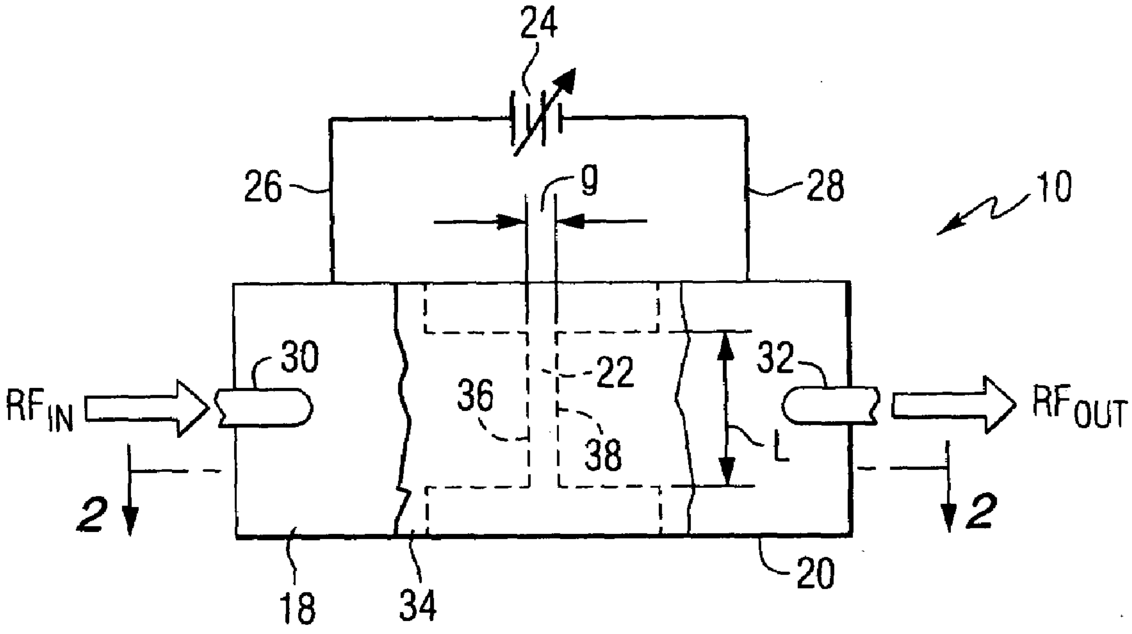
FIG. 1 PRIOR ART
FIG. 1 is a top plan view of a planar voltage tunable varactor as described in U.S. patent application Ser. No. 09/419,126 that can be used in the preferred embodiment of the present invention.
Figure 2:
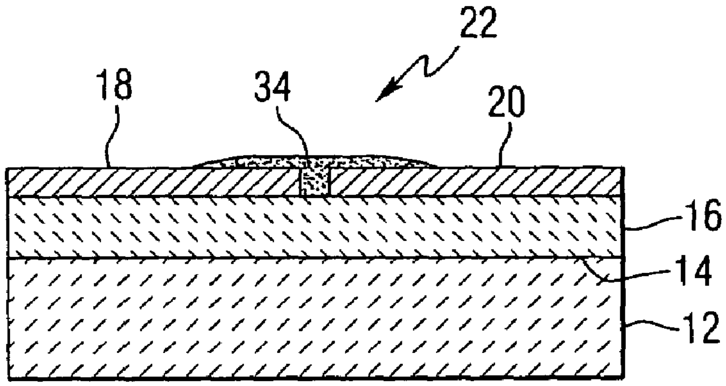
FIG. 2 PRIOR ART
FIG. 2 is a cross-sectional view of the varactor of FIG. 1, taken along line 2—2.

Referring to the drawings, FIGS. 1 and 2 are top and cross sectional views of a varactor 10 as described in the above-mentioned U.S. patent application Ser. No. 09/419,126. The varactor 10 includes a substrate 12 having a generally planar top surface 14. A tunable dielectric layer 16 is positioned adjacent to the top surface of the substrate. A pair of metal electrodes 18 and 20 is positioned on top of the dielectric layer. The substrate 12 is comprised of a material having a relatively low permittivity such as MgO, Alumina, $LaAlO_3$, Sapphire, or a ceramic. For the purposes of this invention, a low permittivity is a permittivity of less than about 30. The tunable dielectric layer 16 is comprised of a material having a permittivity in a range from about 20 to about 2000, and having a tunability in the range from about 10% to about 80% at a bias voltage of about 10 V/μm. In the preferred embodiment this layer is preferably comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO—MgO, BSTO—$MgAl_2O_4$, BSTO—$CaTiO_3$, BSTO—$MgTiO_3$, BSTO—$MgSrZrTiO_6$, and combinations thereof. The tunable layer in one preferred embodiment has a dielectric permittivity greater than 100 when subjected to typical DC bias voltages, for example, voltages ranging from about 5 volts to about 300 volts. A gap 22 of width g, is formed between the electrodes 18 and 20. The gap width must be optimized to increase ratio of the maximum capacitance $C_{max}$ to the minimum capacitance $C_{min}$ ($C_{max}/C_{min}$) and increase the quality facto (Q) of the device. The width of this gap has the most influence on the varactor parameters. The optimal width, g, will be determined by the width at which the device has maximum $C_{max}/C_{min}$ and minimal loss tangent.

A controllable voltage source 24 is connected by lines 26 and 28 to electrodes 18 and 20. This voltage source is used to supply a DC bias voltage to the dielectric layer, thereby controlling the permittivity of the layer. The varactor also includes an RF input 30 and an RF output 32. The RF input and output are connected to electrodes 18 and 20, respectively, by soldered or bonded connections.

The varactors may use gap widths of less than 5–50 μm. The thickness of the dielectric layer ranges from about 0.1 μm to about 20 μm. A sealant 34 is positioned within the gap and can be any non-conducting material with a high dielectric breakdown strength to allow the application of high voltage without arcing across the gap. In the preferred embodiment, the sealant can be epoxy or polyurethane.

The length of the gap L can be adjusted by changing the length of the ends 36 and 38 of the electrodes. Variations in the length have a strong effect on the capacitance of the varactor. The gap length will optimized for this parameter. Once the gap width has been selected, the capacitance becomes a linear function of the length L. For a desired capacitance, the length L can be determined experimentally, or through computer simulation.

The thickness of the tunable dielectric layer also has a strong effect on the $C_{max}/C_{min}$. The optimum thickness of the ferroelectric layers will be determined by the thickness at which the maximum $C_{max}/C_{min}$ occurs. The ferroelectric layer of the varactor of FIGS. 1 and 2 can be comprised of a thin film, thick film, or bulk dielectric material such as Barium-Strontium Titanate, $Ba_xSr_{1-x}TiO_3$ (BSTO), BSTO and various oxides, or a BSTO composite with various dopant materials added. All of these materials exhibit a low loss tangent. For the purposes of this description, for operation at frequencies ranging from about 1.0 GHz to about 10 GHz, the loss tangent would range from about 0.0001 to about 0.001. For operation at frequencies ranging from about 10 GHz to about 20 GHz, the loss tangent would range from about 0.001 to about 0.01. For operation at frequencies ranging from about 20 GHz to about 30 GHz, the loss tangent would range from about 0.005 to about 0.02.

The electrodes may be fabricated in any geometry or shape containing a gap of predetermined width. The required current for manipulation of the capacitance of the varactors disclosed in this invention is typically less than 1 μA. In the preferred embodiment, the electrode material is gold. However, other conductors such as copper, silver or aluminum, may also be used. Gold is resistant to corrosion and can be readily bonded to the RF input and output. Copper provides high conductivity, and would typically be coated with gold for bonding or nickel for soldering. The varactors of FIGS. 1 and 2 can be fabricated using bulk, thick film, and thin film techniques.

FIG*s*. 1 and 2 show a voltage tunable planar varactor having a planar electrode with a predetermined gap distance on a single layer tunable bulk, thick film or thin film dielectric. The applied voltage produces an electric field across the gap of the tunable dielectric that produces an overall change in the capacitance of the varactor. The width of the gap can range from 5 to 50 μm depending on the performance requirements.

Figure 3A:
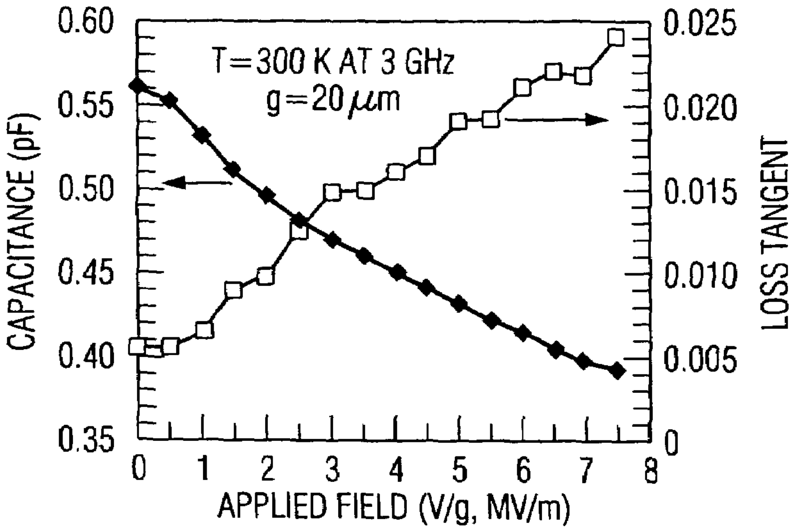
FIG. 3a PRIOR ART
FIGS. 3*a*, 3*b* and 3*c* are graphs illustrating the capacitance and loss tangent of voltage tunable varactors constructed in accordance with this invention at various operating frequencies and gap widths.
Figure 3B:
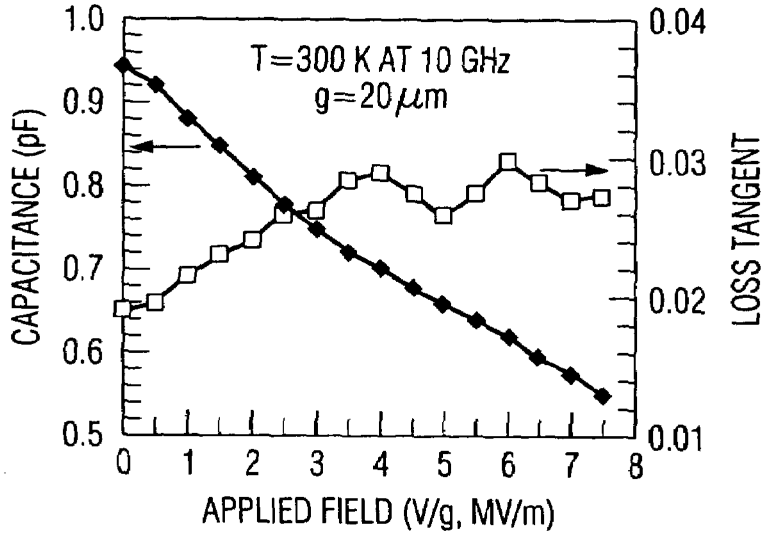
FIG. 3b PRIOR ART
Figure 3C:
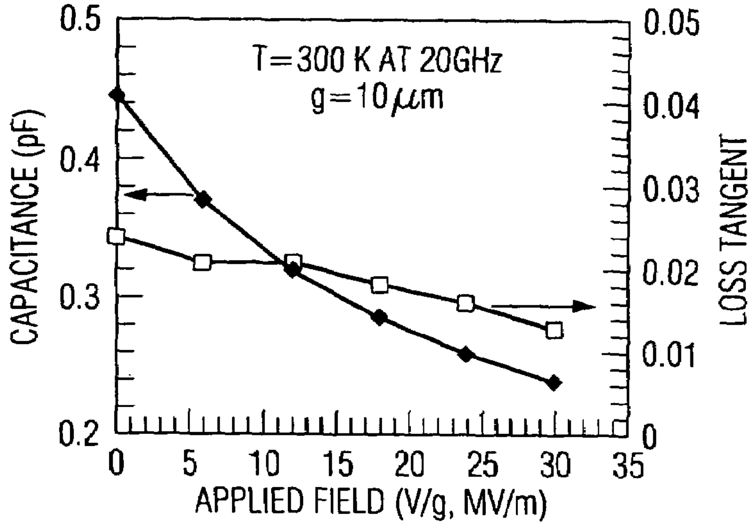
FIG. 3c PRIOR ART

Such varactors operate at room temperature and can have Q factors ranging from about 50 to about 10,000 when operated at frequencies ranging from about 1 GHz to about 40 GHz. The capacitance (in pF) and the loss factor (tan δ) of the varactors measured at 3, 10 and 20 GHz for gap distances of 10 and 20 μm are shown in FIGS. 3*a*, 3*b* and 3*c*. Based on the data shown in FIGS. 3*a*, 3*b* and 3*c*, the Q's for the varactors are approximately the following: 200 at 3 GHz, 80 at 10 GHz, 45–55 at 20 GHz. In comparison, typical Q's for GaAs semiconductor diode varactors are as follows: 175 at 2 GHz, 35 at 10 GHz and much less at even higher frequency. Therefore at frequencies greater than or equal to 10 GHz the varactors of this invention have much better Q factors.

Figure 4:
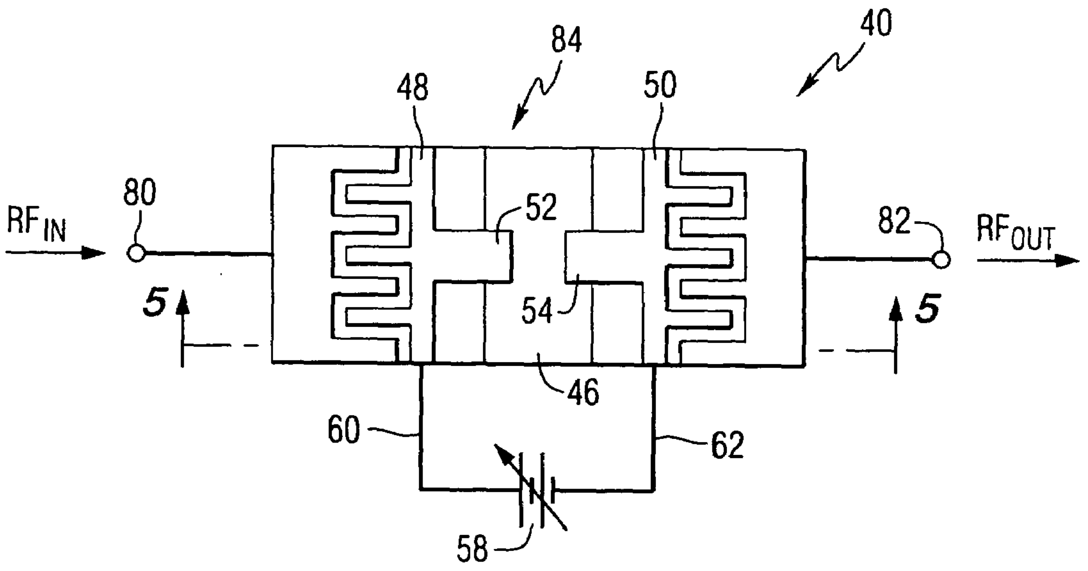
FIG. 4 PRIOR ART
FIG. 4 is a top view of a planar varactor assembly with built-in DC blocking capacitors as described in U.S. patent application Ser. No. 09/434,433.
Figure 5:
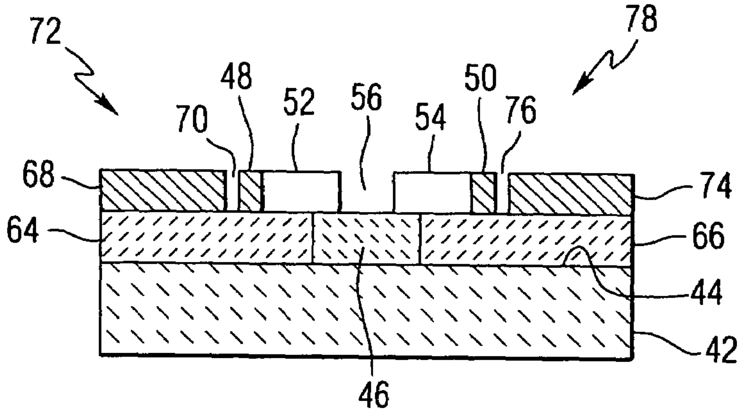
FIG. 5 PRIOR ART
FIG. 5 is a cross sectional view of the varactor assembly of FIG. 4, taken along line 5—5.

Referring to the drawings, FIGS. 4 and 5 are top and cross sectional views of a varactor assembly 40 having built in DC blocking capacitors as described in U.S. patent application Ser. No. 09/434,433. The varactor assembly 40 includes a substrate 42 having a generally planar top surface 44. A tunable dielectric layer 46 is positioned adjacent to the top surface of the substrate. Metal electrodes 48 and 50 are positioned on top of the dielectric layer. The electrodes 48 and 50 are shaped to have projections 52 and 54. The ends of these projections form a gap 56 on the surface of the tunable dielectric layer. The combination of electrodes 48 and 50, and tunable dielectric layer 46 form a tunable capacitor 84. The capacitance of the tunable capacitor can be changed by applying a bias voltage to the electrodes 48 and 50.

In the preferred embodiment, the substrate 42 is comprised of a material having a relatively low permittivity such as MgO, Alumina, $LaAlO_3$, Sapphire, or a ceramic. For the purposes of this description, a low permittivity is a permittivity of less than about 30. In the preferred embodiment, the tunable dielectric layer 16 is comprised of a material having a permittivity in a range from about 20 to about 2000, and having a tunability in the range from about 10% to about 80% at a bias voltage of about 10 V/μm. The tunable dielectric layer can be comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO—MgO, BSTO—$MgAl_2O_4$, BSTO—$CaTiO_3$, BSTO—$MgTiO_3$, BSTO—$MgSrZrTiO_6$, and combinations thereof. The dielectric film of the dielectric capacitor may be deposited by screen printer, laser ablation, metal-organic solution deposition, sputtering, or chemical vapor deposition techniques. The tunable layer in one preferred embodiment has a dielectric permittivity greater than 100 when subjected to typical DC bias voltages, for example, voltages ranging from about 5 volts to about 300 volts. The gap width must be optimized to increase ratio of the maximum capacitance $C_{max}$ to the minimum capacitance $C_{min}$ ($C_{max}/C_{min}$) and increase the quality factor (Q) of the device. The width of this gap has the most influence on the varactor parameters. The optimal width, g, will be determined by the width at which the device has maximum $C_{max}/C_{min}$ and minimal loss tangent.

A controllable voltage source 58 is connected by lines 60 and 62 to electrodes 48 and 50. This voltage source is used to supply a DC bias voltage to the dielectric layer, thereby controlling the permittivity of the layer. The varactor assembly further includes first and second non-tunable dielectric layers 64 and 66 positioned adjacent to the generally planar surface of the substrate 42 and on opposite sides of the tunable dielectric layer 46. Electrode 48 extends over a portion of the top surface of non-tunable material 64. Electrode 68 is positioned adjacent a top surface of non-tunable layer 64 such that a gap 70 is formed between electrodes 48 and 68. The combination of electrodes 48 and 68 and non-tunable layer 64 forms a first DC blocking capacitor 72. The varactor assembly also includes an RF input 80 and an RF output 82.

Electrode 74 is positioned adjacent a top surface of non-tunable layer 66 such that a gap 76 is formed between electrodes 50 and 74. The combination of electrodes 50 and 74 and non-tunable layer 66 forms a second DC blocking capacitor 78. The dielectric films of the DC blocking capacitors may be deposited by screen printer, laser ablation, metal-organic solution deposition, sputtering, or chemical vapor deposition techniques.

Figure 6:
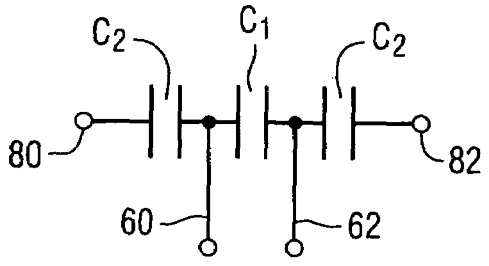
FIG. 6 PRIOR ART
FIG. 6 is a schematic diagram of the varactor of FIGS. 4 and 5.

An RF input 80 is connected to electrode 68. An RF output 82 is connected to electrode 74. The RF input and output are connected to electrodes 68 and 74, respectively, by soldered or bonded connections. The non-tunable dielectric layers 64 and 66, in the DC blocking capacitors 72 and 78, are comprised of a high dielectric constant material, such as a BSTO composite. The DC blocking capacitors 72 and 78 are electrically connected in series with the tunable capacitor 84 to isolate the DC bias from the outside of the varactor assembly 40. To increase the capacitance of the two DC blocking capacitors 72 and 78 the electrodes have an interdigital arrangement as shown in FIG. 4. FIG. 6 is a schematic diagram of the varactor of FIGS. 4 and 5 showing the three capacitors formed by the structure.

In the preferred embodiments, the varactors may use gap widths of 5–50 μm. The thickness of the tunable dielectric layer ranges from about 0.1 μm to about 20 μm. A sealant can be inserted into the gaps to increase breakdown voltage. The sealant can be any non-conducting material with a high dielectric breakdown strength to allow the application of high voltage without arcing across the gap, for example, epoxy or polyurethane.

This invention utilizes room temperature tunable dielectric the varactors such as those shown in FIGS. 1, 2, 4 and 5 in an electronically tunable RF filter. The lump element filter in the present invention may be low-pass, high-pass, band-pass, or band-stop designed by Bessel, Butterworth, Chebyshev, Elliptical or other methods.

Figure 7:
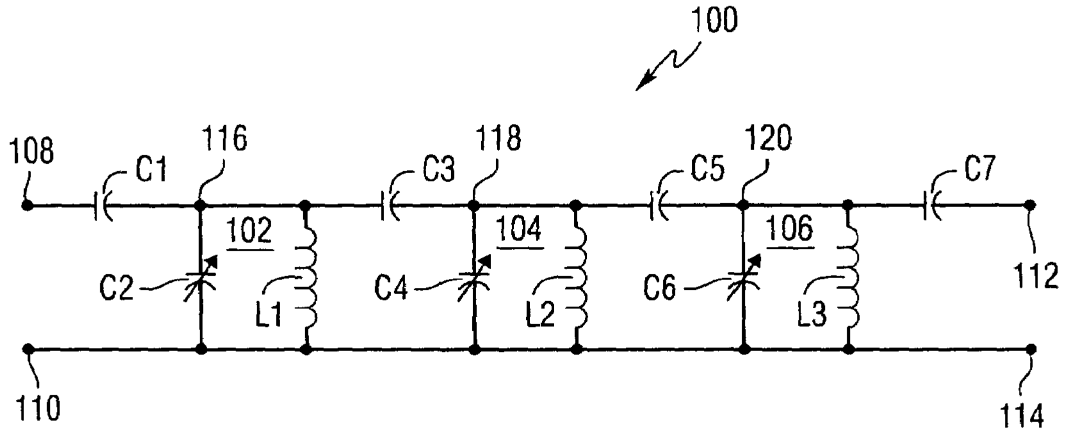
FIG. 7 is a schematic diagram of an example Chebyshev bass-pass filter constructed in accordance with this invention.

FIG. 7 is a schematic diagram of a band pass filter 100 constructed in accordance with this invention. This capacitor coupled LC filter circuit, which is commonly referred to as a capacitively coupled tank circuit, includes a plurality of resonators 102, 104 and 106 with capacitive coupling between those resonators, input connection points 108 and 110, and output connection points 112 and 114. In particular, resonator 102, comprising the parallel connection of capacitor C2 and inductor L1, is connected to node 116 and input connection point 110 and output connection point 114, and is coupled to input connection point 108 through capacitor C1. Similarly, resonator 104, comprising the parallel connection of capacitor C4 and inductor L2, is connected to node 118 and input connection point 110 and output connection point 114, and is coupled to node 116 through capacitor C3. Resonator 106, comprising the parallel connection of capacitor C6 and inductor L3, is connected to node 120 and input connection point 110 and output connection point 114, and is coupled to node 118 through capacitor C5. In addition, resonator 106 is coupled to output connection point 112 through capacitor C7. The filter is tuned by varactors C2, C4 and C6, which in the preferred embodiment are constructed in accordance with either FIGS. and 1 and 2 or FIGS. 4 and 5. Common connection points 110 and 114 may be connected to ground.

Figure 8:
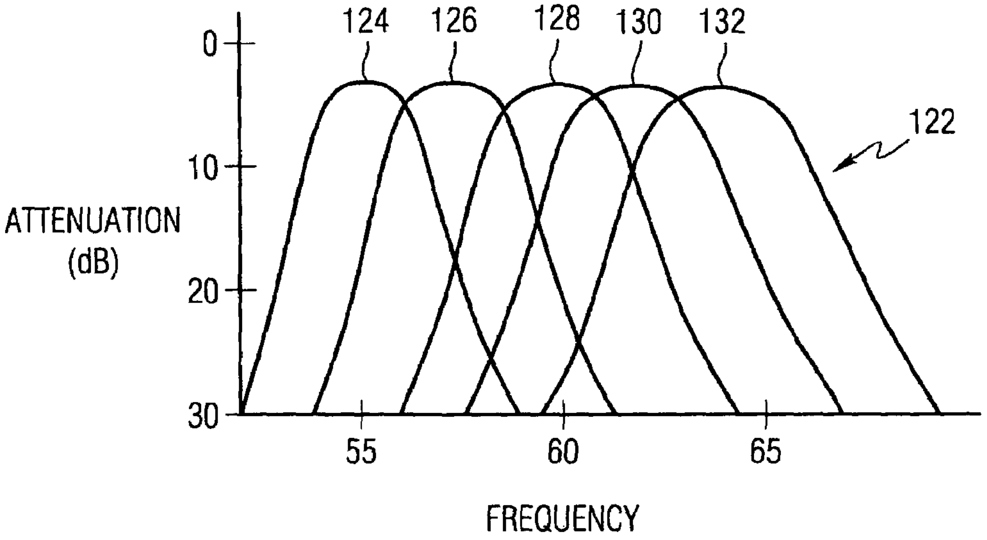
FIG. 8 is a graph of the attenuation of the filter shown in FIG. 7 operated at various bias voltages on the varactors.

In the preferred embodiment, with zero bias voltage on the tunable capacitors, capacitors C1 and C7 are 5.6 pF, capacitors C3 and C5 are 0.48 pF, capacitors C2 and C6 are 8.0 pF, capacitor C4 is 13.1 pF, and inductors L1, L2 and L3 are 500 nH. The input and output of the filter are matched to 50 Ω. FIG. 8 is a graph 122 of the attenuation of the filter shown in FIG. 7 wherein capacitors C2, C4 and C6 are voltage tunable varactors operated at various bias voltages. Curves 124, 126, 128, 130 and 132 shown the filter attenuation at the bias voltages shown in Table I.

TABLE I

| | Varactor bias voltages. | | |
|---|---|---|---|
| Curve | C2 Bias | C4 Bias | C6 Bias |
| 124 | 0 | 0 | 0 |
| 126 | 180 | 80 | 180 |
| 128 | 400 | 160 | 400 |
| 130 | 600 | 210 | 600 |
| 132 | 700 | 500 | 700 |

Figure 9:
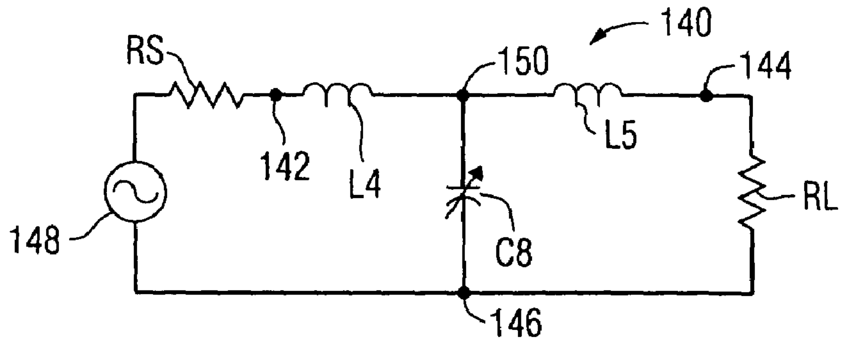
FIG. 9 is a schematic diagram of a low pass filter constructed in accordance with this invention.

FIG. 9 is a schematic diagram of a low pass filter constructed in accordance with this invention. In FIG. 9, low pass filter 140 includes an input connection point 142, and output connection point 144 and a common connection point 146. An RF source 148 supplies an RF signal to the filter. Resistor RS represents the filter input impedance. A load as represented by resistor RL is connected between the output connection point 144 and the common connection point 146. Inductors L4 and L5 are electrically connected in series between input connection point 142 and output connection point 144. A tunable varactor as represented by capacitor C8 is connected between the common connection point 146 and a node 150 between inductors L4 and L5.

Figure 10:
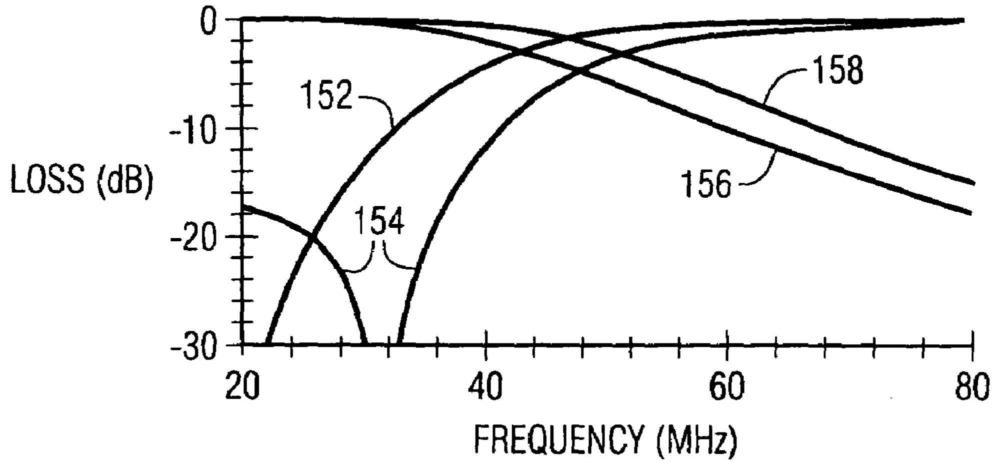
FIG. 10 is a graph of the losses of the filter shown in FIG. 9 operated at various bias voltages on the varactor.

FIG. 10 is a graph of the losses of the filter shown in FIG. 9 operated at various bias voltages on the varactor. In the embodiment used to construct the graph of FIG. 10, RS=RL=50 Ω, L4=L5=217 nH, and C8=133.8 pF at zero bias. Curves 156 and 152 represent the insertion loss and return loss at zero bias voltage, respectively. Curves 158 and 154 represent the insertion loss and return loss at 500 volts bias, respectively.

Figure 11:
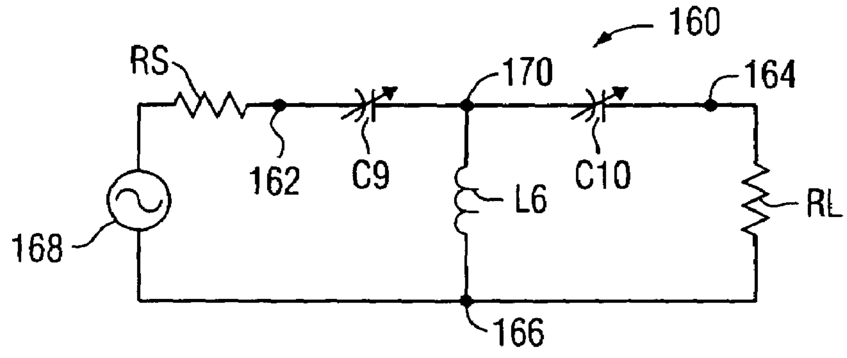
FIG. 11 is a schematic diagram of a high pass filter constructed in accordance with this invention.

FIG. 11 is a schematic diagram of a high pass filter constructed in accordance with this invention. In FIG. 11, high pass filter 160 includes an input connection point 162, and output connection point 164 and a common connection point 166. An RF source 168 supplies an RF signal to the filter. Resistor RS represents the input impedance of the filter. A load as represented by resistor RL is connected between the output connection point 164 and the common connection point 166. Tunable varactors as represented by capacitors C9 and C10 are electrically connected in series between input connection point 162 and output connection point 164. Inductor L6 is connected between the common connection point 166 and a node 170 between capacitors C9 and C10.

Figure 12:
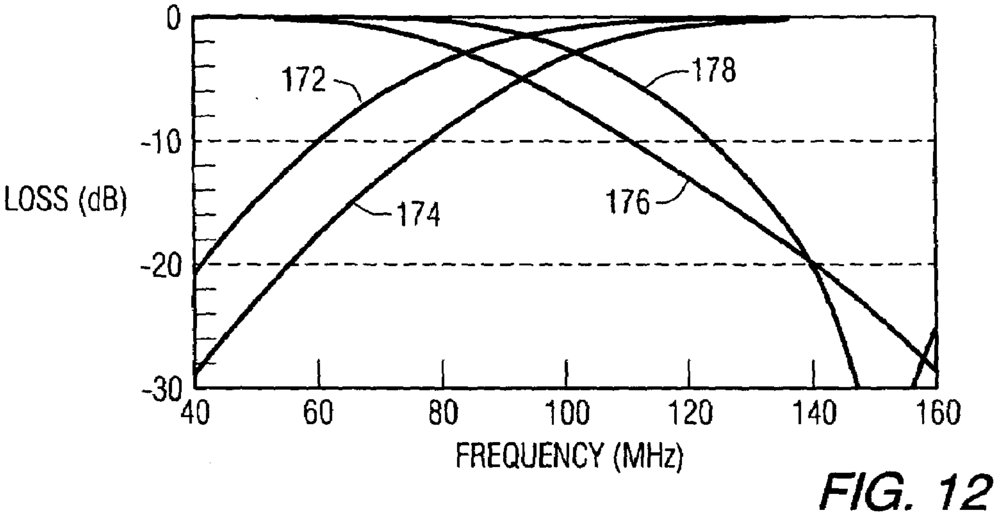
FIG. 12 is a graph of the losses of the filter shown in FIG. 11 operated at various bias voltages on the varactors.

FIG. 12 is a graph of the losses of the filter shown in FIG. 11 operated at various bias voltages on the varactor. In the embodiment used to construct the graph of FIG. 10, RS=RL=50 Ω, L6=52.6 nH, and C9=C10=32.4 pF at zero bias. Curves 172 and 176 represent the insertion loss and return loss at zero bias voltage, respectively. Curves 174 and 178 represent the insertion loss and return loss at 600 volts bias, respectively.

Figure 13:
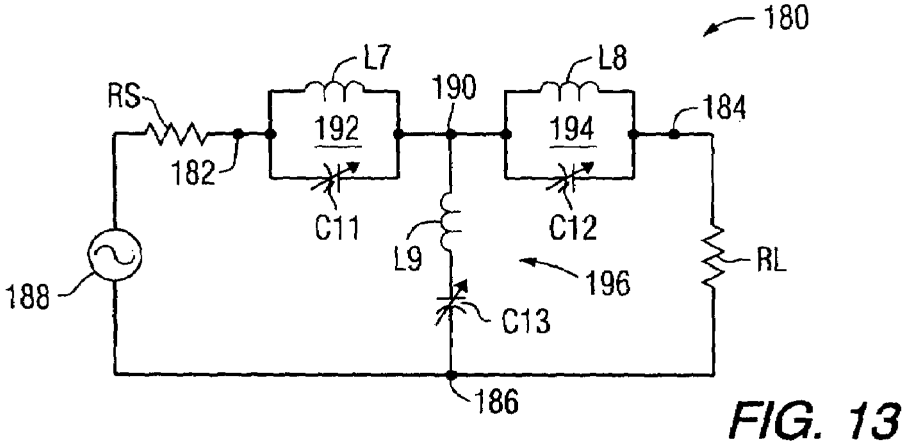
FIG. 13 is a schematic diagram of a band stop filter constructed in accordance with this invention.

FIG. 13 is a schematic diagram of a band stop filter 180 constructed in accordance with this invention. In FIG. 13, band stop filter 180 includes an input connection point 182, and output connection point 184 and a common connection point 186. An RF source 188 supplies and RF signal to the filter. Resistor RS represents the input impedance of the filter. A load as represented by resistor RL is connected between the output connection point 184 and the common connection point 186. A first circuit branch 192 comprising the parallel connection of inductor L7 and a varactor represented by capacitor C11 is electrically connected between input connection point 182 and node 190. A second circuit branch 194 comprising the parallel connection of inductor L8 and a varactor represented by capacitor C12 is electrically connected between output connection point 184 and node 190. A third circuit branch 196 comprising the series connection of inductor L9 and a varactor represented by capacitor C13 is electrically connected between common connection point 186 and node 190.

Figure 14:
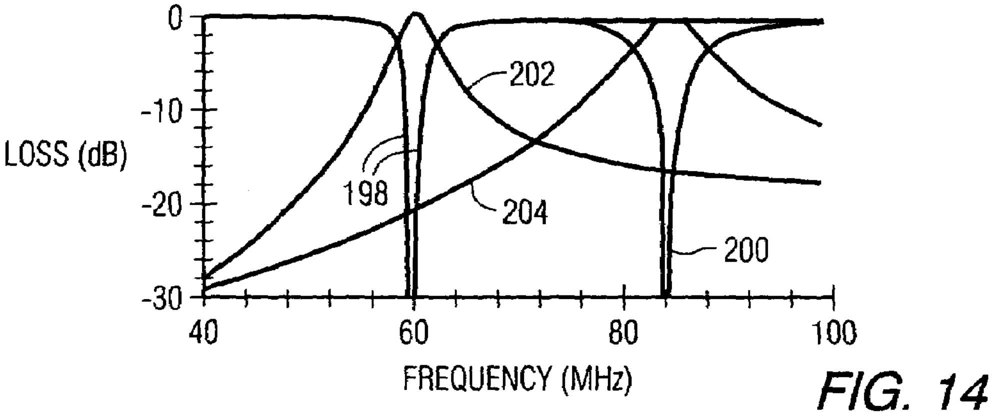
FIG. 14 is a graph of the losses of the filter shown in FIG. 13 operated at various bias voltages on the varactors.

FIG. 14 is a graph of the losses of the filter shown in FIG. 13 operated at various bias voltages on the varactors. In the embodiment used to construct the graph of FIG. 13, RS=RL=50 Ω, L7=L8=7.83 nH, L9=1457 nH, C11=C12=899 pF at zero bias voltage, and C13=4.83 pF at zero bias. Curves 198 and 202 represent the insertion loss and return loss at zero bias voltage, respectively. Curves 200 and 204 represent the insertion loss and return loss at 500 volts bias, respectively.

The lumped element filter in the present invention may be designed by Bessel, Butterworth, Chebyshev, Elliptical or other methods. Examples of band-pass, low pass, high pass and band stop filters have been presented. Dielectric varactors with built-in DC blocks can be used in the filter as the tunable elements. By utilizing low loss (tan $\delta<0.02$) dielectrics of predetermined dimensions, the varactors of FIGS. 1, 2, 4 and 5 can operate at high levels at high frequencies, for example, greater than 3 GHz.

The dielectric varactors of FIGS. 1, 2, 4 and 5 operate at high speeds, with high Quality Factor (Q), high power handling, and more importantly low intermodulation distortion products. Filters using dielectric varactors have better performance than semiconductor diode-tuned filters, especially in the properties of high power handling, low intermodulation distortion, and the ability to cover capacitance ranges that are not possible with conventional varactors.

In the preferred embodiment, varactors using dielectric materials can work at much higher capacitance values than conventional diode varactors. This allows the construction of compact electronically tunable filters using lumped element capacitors with performances that are not possible with conventional varactors. A low loss, highly tunable dielectric varactor with or without built-in DC blocks may be used in the present invention, the built-in DC block dielectric varactor may reduce DC block insertion loss, and make it easier to use in the filter design. In addition, the tunable dielectric varactors of this invention have increased RF power handling capability and reduced power consumption and cost.

Accordingly the present invention, by utilizing dielectric varactors, provides high performance electrically tunable filters that operate in the RF frequency range. This invention has many practical applications and many other modifications of the disclosed devices may be obvious to those skilled in the art without departing from the spirit and scope of this invention. While the present invention has been described in terms of what are at present its preferred embodiments, various modifications of such embodiments can be made without departing from the scope of the invention, which is defined by the claims.

What is claimed is:

1. A tunable filter comprising:

an input connection point;

an output connection point; and a first circuit branch electrically coupled to said input connection point and said output and including a voltage tunable dielectric varactor electrically connected to an inductor, wherein said varactor includes non-tunable built-in DC blocking capacitors.

2. A tunable filter in accordance with claim 1, wherein the filter comprises one of a low-pass, high-pass, band-pass, or band-stop filter.

3. A tunable filter in accordance with claim 1, wherein said tunable dielectric material are selected from the group consisting of:

BSTO—MgO, BSTO—MgAl2O4, BSTO—CaTiO3, BSTO—MgTiO3, BSTO—MgSrZrTiO6, and combinations thereof.

4. A tunable filter in accordance with claim 1, wherein said voltage tunable dielectric material is a BSTO-composite ceramic material.

5. A tunable filter in accordance with claim 4, wherein said voltage tunable dielectric varactor further comprises:

an insulating material in said gap.

6. A tunable filter in accordance with claim 4, wherein the tunable dielectric layer has a permittivity greater than about 100.

7. A tunable filter in accordance with claim 4, wherein the substrate has a permittivity of less than about 30.

8. A tunable filter in accordance with claim 4, wherein the substrate comprises one of the group of: MgO, Alumina, $LaAlO_3$, sapphire, and a ceramic.

9. A tunable filter in accordance with claim 4, wherein the tunable dielectric layer comprises one of:

a tunable dielectric thick film;

a tunable dielectric bulk ceramic; and a tunable dielectric thin film.

10. A tunable filter in accordance with claim 4, wherein the tunable dielectric includes an RF input and an RF output for passing an RF signal through the tunable dielectric layer in a first direction, and wherein the gap extends in a second direction substantially perpendicular to the first direction.

11. A method of tuning a filter, comprising:

inputting a signal at an input connection point;

outputting a signal at an output connection point; and coupling a first circuit branch electrically to said input connection point and said output connection point and including a voltage tunable dielectric varactor electrically connected to an inductor, wherein said varactor includes non-tunable built-in DC blocking capacitors.

12. The method of claim 11, wherein the filter comprises one of a low-pass, high-pass, band-pass, or band-stop filter.

13. The method of claim 11, wherein the filter comprises one of a Bessel, Butterworth, Chebyshev or elliptical filter.

* * * * *